United States Patent
Chang (10) Patent No.: US 7,324,572 B2
(45) Date of Patent: Jan. 29, 2008

(54) LASER DRIVER CIRCUIT FOR BURST MODE TRANSMISSION AND FABRICATION METHOD THEREOF

(75) Inventor: Yi-Yang Chang, Taichung (TW)

(73) Assignee: Asia Optical Co., Inc., Taichung (TW)

( * ) Notice: Subject to any disclaimer, the term of this patent is extended or adjusted under 35 U.S.C. 154(b) by 393 days.

(21) Appl. No.: 10/923,847

(22) Filed: Aug. 24, 2004

(65) Prior Publication Data

US 2005/0152416 A1   Jul. 14, 2005

(30) Foreign Application Priority Data

Jan. 14, 2004   (TW) .............................. 93100938 A (51) Int. Cl.
*H01S 3/00* (2006.01)
(52) U.S. Cl. .................... 372/38.02; 372/38.1
(58) Field of Classification Search ............. 372/38.02
See application file for complete search history.

(56) References Cited

U.S. PATENT DOCUMENTS

| | | | | |
|---|---|---|---|---|
| 5,548,435 | A * | 8/1996 | Tahara et al. ............... | 398/195 |
| 6,078,150 | A * | 6/2000 | Koyanagi et al. ............ | 315/309 |
| 7,068,692 | B2 * | 6/2006 | Chang ..................... | 372/38.02 |
| 2002/0075919 | A1 * | 6/2002 | Tochio .................... | 372/38.02 |
| 2002/0118424 | A1 * | 8/2002 | Miki et al. .................. | 359/187 |
| 2003/0210917 | A1 * | 11/2003 | Stewart et al. ............. | 398/209 |
| 2005/0001152 | A1 * | 1/2005 | Stewart et al. .......... | 250/214 R |

\* cited by examiner

*Primary Examiner*—Armando Rodriguez
*Assistant Examiner*—Phillip Nguyen (57) ABSTRACT

A method for making a laser driver circuit for burst mode is described. The method includes the following steps: First, a continuous mode laser driver circuit is selected, the chip having a temperature compensation output, a bias current setting input, and a reference current setting input. Next, the temperature compensation signal is converted to a reference current setting signal via a first bias adjustment circuit, and the reference current setting signal is input to the reference current setting input. Then, the bias current setting input is connected to ground via a second bias adjustment circuit. The reference current setting signal automatically adjusts the high level and the low level of the eye diagram of the laser according to the environmental temperature, so that the high level and the low level are kept stable to reduce the bit error rate in transmission.

20 Claims, 7 Drawing Sheets

LASER DRIVER CIRCUIT FOR BURST MODE TRANSMISSION AND FABRICATION METHOD THEREOF

RELATED APPLICATIONS

The present application is based on, and claims priority from, Taiwanese Application Number 93100938, filed Jan. 14, 2004, the disclosure of which is hereby incorporated by reference herein in its entirety.

BACKGROUND

1. Field of Invention

The present invention relates to a design and fabrication method of a laser transmitting apparatus. More particularly, the present invention relates to a design and fabrication method of a laser transmitting apparatus for utilizing a continuous mode laser driver circuit for a burst mode transmission application where the high level and the low level of the laser power eye diagram are stably maintained so as to decrease the bit error rate in transmission process.

2. Description of Related Art

In the past, signals of optical fiber communication were usually transmitted in continuous mode. In continuous mode, since no signal can be interrupted during the transmission process, the optical fiber communication structure can only be that in which one receiver connects to one transmitter. This structure is also called a P2P (point to point) structure.

However, if FTTX (fiber to the X, where X represents a home, building, etc.) is used, the signals do not need to be transmitted all the time, and thus it is a waste of communication bandwidth to use a P2P communication apparatus.

Thus, optical fiber communication system designers have developed a FSAN (full service access network) structure for FTTX applications. In FSAN, an important concept is P2MP (point to multi points). When a user wants to transmit some information, the user is allowed to transmit the information immediately. After the completion of transmitting the information, the user is allowed to turn the laser power off to avoid signal conflicts. Such transmission is called burst mode, which is different from the continuous mode mentioned above.

For an optical fiber communication system used for burst mode applications, a major component is the laser driver chip. For burst mode laser driving, the laser driver circuit must be able to turn on in a very short time and drive a communication laser diode to transmit a signal and then be able to turn off the laser diode completely and rapidly when there is no signal input.

In the FSAN standard, there is no clear definition for the signal present time and stop time in burst mode. Therefore, system integration companies have developed many different solutions. Some of the solutions need a strict timing control. Thus, the laser driver chip is difficult to assemble and the production cost is also increased.

In burst mode optical fiber communication systems, when the NZR (non return to zero) data rate is lower than 1.5 Gbps, direct modulation of the laser driver can be used. When the NRZ data rate is higher than 1.5 Gbps, an external modulator is needed. This invention concerns burst mode optical fiber communication in which the NRZ data rate is lower than 1.5 G.

In direct modulation, a bias current and a modulation current are needed for a laser diode. Usually, a laser driver chip is responsible for providing the bias current and the modulation current. The laser driver circuit receives the input voltage signal and then converts the input voltage signal into a current.

For continuous mode, many types of integrated circuit are available on the market, but for burst mode, only a few specially designed integrated circuits are available. The specially designed integrated circuits are, for example, chips having DAPC (digital automatic power control) functionality or chips having external bias capacitors.

The external bias capacitor is used to control the stability of the laser light. The specially designed integrated circuits mentioned above have the disadvantages of high price and long bias current setting time.

Therefore, a laser transmitting apparatus that does not need digital automatic power control or an external bias capacitor is in great need, one that only requires the automatically adjusted modulation current and bias current in response to the environmental temperature, so that the high level and the low level of the laser power eye diagram of the laser power are stably maintained.

SUMMARY

It is therefore an objective of the present invention to provide a method and a laser transmitting apparatus for utilizing a continuous mode laser driver circuit for a burst mode application, where the laser transmitting apparatus automatically adjusts a reference current in response to the environmental temperature and stably maintains the high level and the low level of the laser power eye diagram through a bias current.

It is another objective of the present invention to provide a method and a laser transmitting apparatus for utilizing a continuous mode laser driver circuit for a burst mode application, where the laser transmitting apparatus uses an inexpensive continuous mode laser driver chip and adds external circuit to the chip for modification, so that the modified circuit can be used for burst mode applications.

It is still another objective of the present invention to provide a method and a laser transmitting apparatus for utilizing a continuous mode laser driver circuit for a burst mode application, where the laser transmitting apparatus does not need a bias current setting time.

In accordance with the foregoing and other objectives of the present invention, a method for utilizing a continuous mode laser driver circuit for a burst mode application is described. The method includes the following steps. First, a continuous mode laser driver chip is selected. The continuous mode chip has a temperature compensation signal output, a bias current setting input, and a reference current setting input. The chip is used to drive a laser diode to generate a laser light.

Next, the temperature compensation signal from the temperature compensation signal output is converted into a reference current setting signal through a first bias adjustment circuit. The reference current setting signal is input to a reference current setting input. Then, the bias current setting input is grounded through a second bias adjustment circuit. The reference current setting signal automatically adjusts the high level and the low level of the eye diagram of the laser light in response to the environmental temperature, so that the high level and the low level are kept substantially stable to reduce the bit error rate in transmission.

In accordance with the objectives of the present invention, a laser transmitting apparatus for continuous mode applications is described. The laser transmitting apparatus includes a first bias adjustment circuit, a second bias adjustment circuit, and a laser driver circuit. The laser driver circuit is connected to the first bias adjustment circuit and the second bias adjustment circuit.

The laser driver is used to provide a driving current to a laser diode to generate a laser light. The laser driver circuit generates a temperature compensation signal in response to the environmental temperature. The laser driver circuit receives a reference current setting signal to set a reference current. The laser driver circuit receives a bias current setting signal to set a bias current. The reference current is used to set the reference levels for the modulation current and the bias current. The modulation current is used to set the high level of the eye diagram of the laser diode. The bias current is used to set the low level of the eye diagram of the laser diode.

The first bias adjustment circuit receives the temperature compensation signal to generate the reference current setting signal, so that the high level and the low level of the eye diagram do not vary with temperature variation. However, although the high level is maintained stably by this method, the low level might be overcompensated. Thus, the second bias adjustment circuit is used to adjust the overcompensated low level of the eye diagram.

The temperature compensation signal is inversely related to the temperature. That is to say, when the temperature rises, the voltage of the temperature compensation declines. The laser driver circuit stably maintains the high level and the low level of the eye diagram of the laser diode with reference to the bias current and the reference current.

The laser driver circuit was originally designed for continuous mode applications. The laser driver circuit is a laser driver chip. The laser driver circuit has a pulse width adjustment input, a reference current setting input, a bias current setting input, a temperature compensation signal output, and an open loop operation mode. The workable data rate of the laser driver chip is at least 2.5 GHz even if the laser driver circuit is working under the frequency of 1.5 G Hz for a burst mode application. The first bias adjustment circuit is a resistor. The second bias adjustment circuit is also a resistor.

In accordance with the objectives of the present invention, a laser transmitting apparatus for burst mode applications is described. The laser transmitting apparatus includes a laser driver circuit and a temperature sensitive circuit. The temperature sensitive circuit is connected to the laser driver circuit.

The laser driver circuit provides a driving current to a laser diode to generate a laser light. The laser driver circuit receives a modulation current setting signal to set a modulation current. The laser driver circuit also receives a bias current setting signal to set a bias current. The temperature sensitive circuit generates the modulation current setting signal and the bias current signal, both of which have direct relationships with the temperature.

The laser driver circuit can have no temperature compensation signal output or the laser driver circuit would have an inverse relationship between the temperature compensation signal and the environmental temperature. The laser driver circuit substantially stably maintains the high level and the low level of the eye diagram of the laser diode with reference to the bias current and the modulation current.

In accordance with the objectives of the present invention, a laser transmitting apparatus for a burst mode application is also described. The laser transmitting apparatus includes a first bias adjustment circuit, a second bias adjustment circuit, and a laser driver circuit. The laser driver circuit is connected to the first bias adjustment circuit and the second bias adjustment circuit.

The laser driver circuit provides a driving current to a laser diode to generate a laser light. The laser driver circuit generates a temperature compensation signal in response to the environmental temperature. The laser driver circuit receives a modulation current setting signal to set a modulation current. The laser driver circuit receives a bias current setting signal to set a bias current.

The first bias adjustment circuit receives the temperature compensation signal to generate the modulation current setting signal. The second bias adjustment circuit receives the temperature compensation signal to generate a bias current setting signal.

The relationship between the temperature compensation signal and the temperature is directly proportional, and the laser driver circuit substantially stably maintains the high level and the low level of the eye diagram of the laser power with reference to the bias current and the modulation current.

Because the laser transmitting apparatus converts the temperature compensation signal into the modulation current setting signal and the bias current setting signal through bias adjustment circuits, the laser transmitting apparatus can automatically adjust the reference current and the bias current to stably maintain the high level and the low level of the laser power eye diagram.

The laser transmitting apparatus uses an inexpensive continuous mode laser driver chip and adds external circuit to the chip for modification, so that the modified circuit can be used for burst mode application.

Moreover, when transmitting burst data, the laser transmitting apparatus does not have to turn on the input of reference current. Therefore, the laser transmitting apparatus does not need a bias current setting time.

It is to be understood that both the foregoing general description and the following detailed description are examples, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 6:
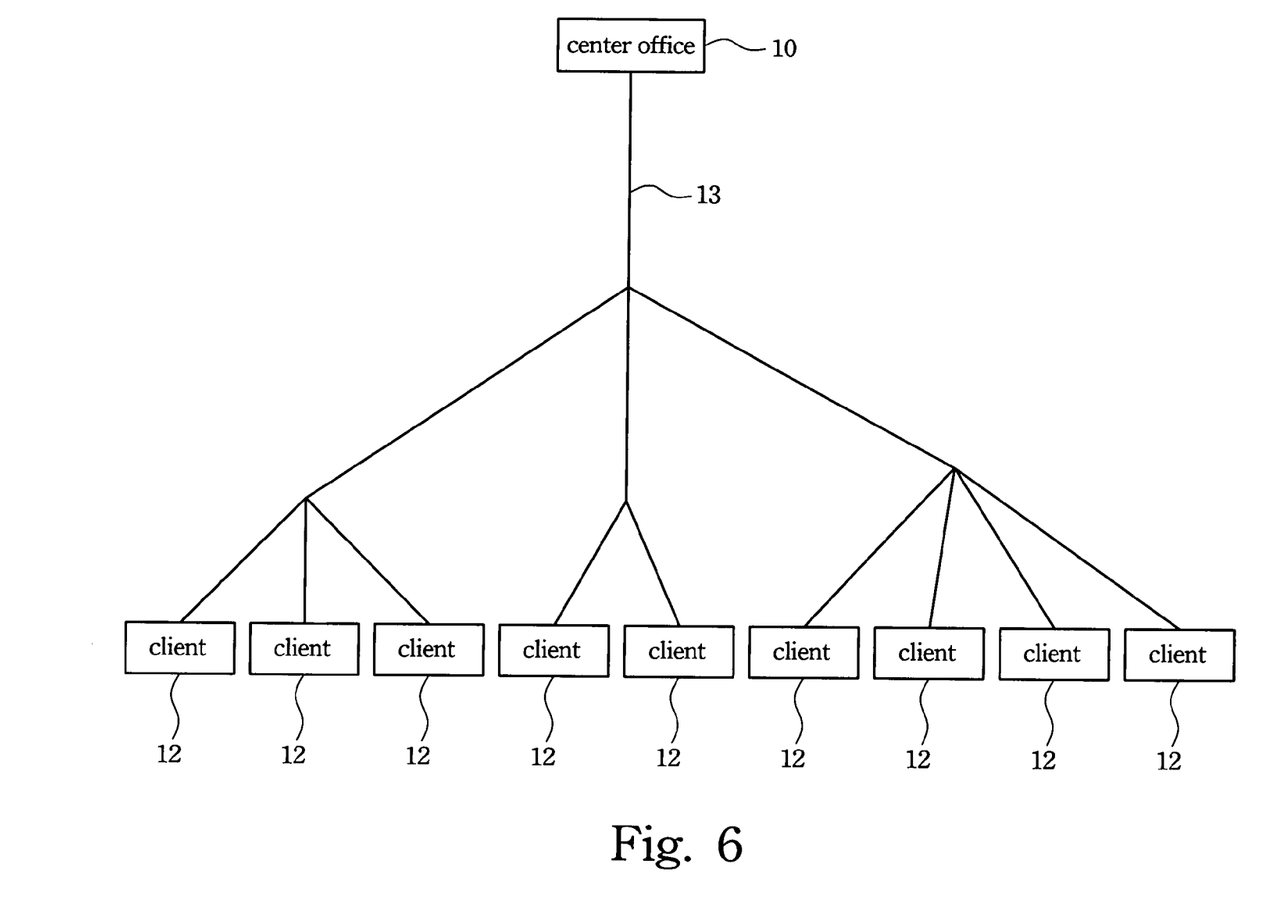
FIG. 6 is a diagram illustrating a P2MP communication system consisting of optical fibers.

FIG. 6 is a diagram illustrating a communication network with the media of fiber optics. Center office 10 is connected to a plurality of clients 12 through branches of fiber 13, thus forming a FTTX structure.

Figure 7:
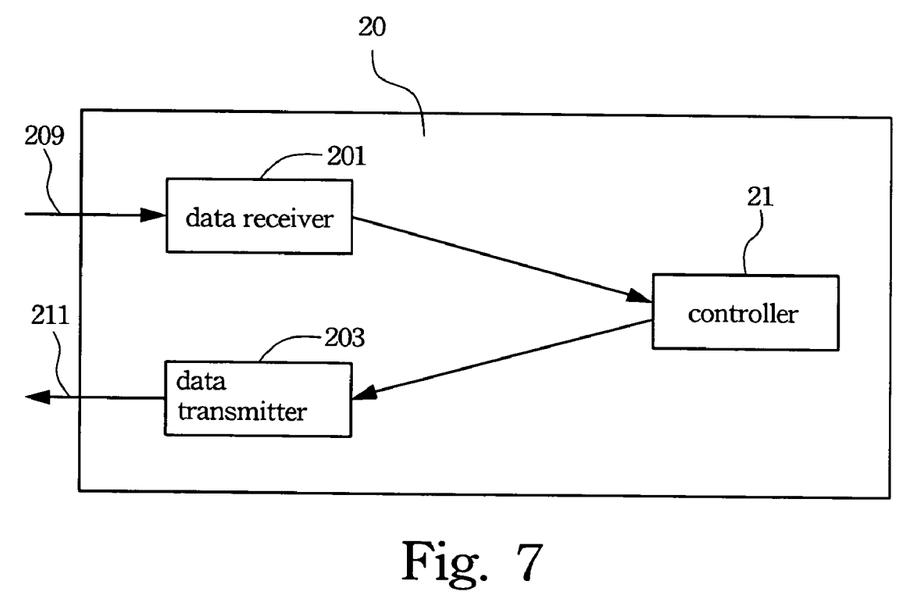
FIG. 7 is a diagram illustrating a fiber optical communication apparatus.

With reference to FIG. 6 and FIG. 7, the following describes an optical fiber communication apparatus 20 installed at the client 12. The optical fiber communication apparatus 20 is connected to the center office apparatus in the center office 10 through the fiber 13. The optical fiber communication apparatus 20 has a data receiver 201, a data transmitter 203, and a controller 21.

The controller 21 further controls the data transmitter 203 through a burst mode signal, so that only in burst mode, the data transmitter 203 uploads data to the center office 10 through the output channel 211 and the fiber 13. The laser driver circuit of the invention is located in the data transmitter 203. The following are descriptions of three preferred embodiments.

Embodiment 1

Figure 2:
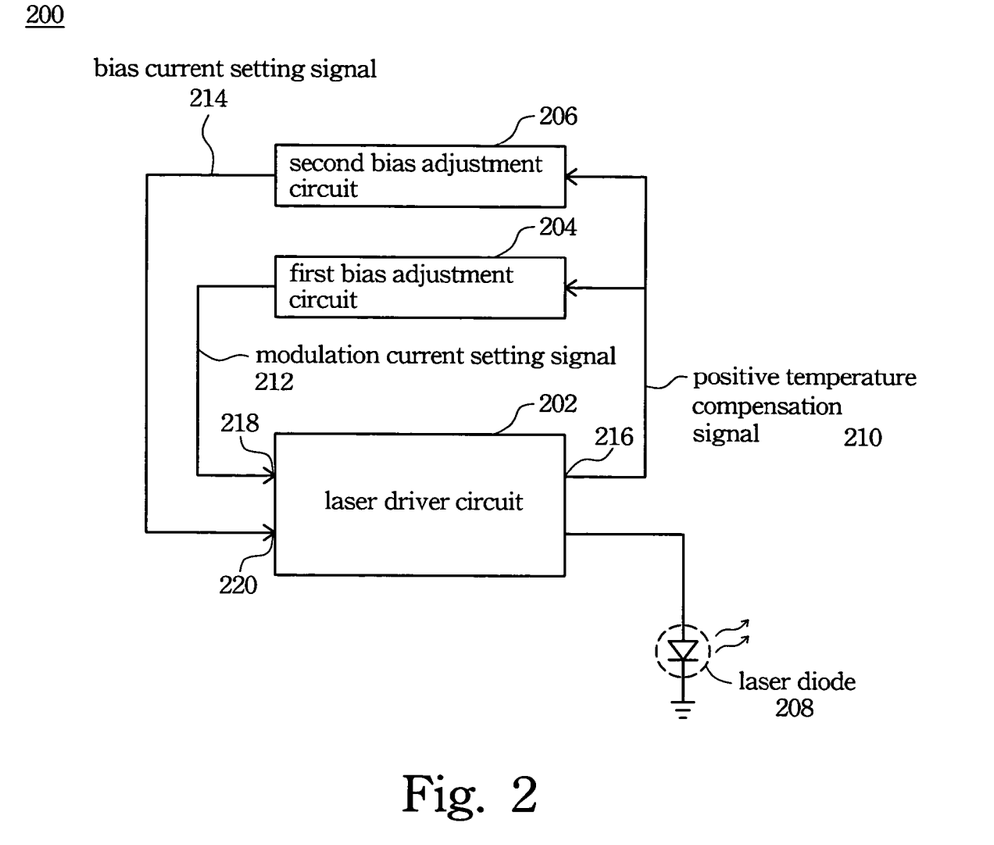
FIG. 2 is a block diagram of the first preferred embodiment of the laser transmitting apparatus.

FIG. 2 is a block diagram of the first preferred embodiment of the laser transmitting apparatus 200. In this embodiment, a laser driver chip originally designed for continuous mode applications is used as the laser driver circuit 202. With external circuit modification, the laser driver circuit is used for burst mode applications. The requirements for selecting the laser driver circuit 202 are as follows. The laser driver circuit 202 must have a pulse width adjustment (PWA) input and a modulation current setting input. The laser driver circuit 202 must be able to generate a temperature compensation signal, such as a linearly positive or negative temperature-compensated voltage signal.

Moreover, the laser driver circuit 202 must be workable in open loop mode and have the functions of bias current setting and modulation current setting. When used in continuous mode, the data rate of the laser driver circuit 202 must be higher than 2.5 GHz.

For example, the Philips TZA 3050 chip has a pulse width adjustment input and a temperature compensation output, and is workable in open loop mode. Therefore, the Philips TZA 3050 is suitable for use as the laser driver circuit 202 of the invention.

FIG. 2 illustrates an embodiment wherein the positive temperature compensation signal 210 is directly related to the temperature. Thus, the slope of the characteristic curve of the positive temperature compensation signal 202 (versus temperature) is positive. With reference to FIG. 2, the laser transmitting apparatus 200 includes a laser driver circuit 202, a first bias adjustment circuit 204, a second bias adjustment circuit 206, and a laser diode 208. The laser driver circuit 200 is connected to the first bias adjustment circuit 204 and the second bias adjustment circuit 206. The laser driver circuit 202 is used to provide a driving current to the laser diode 208 to generate a laser light.

Figure 1A:
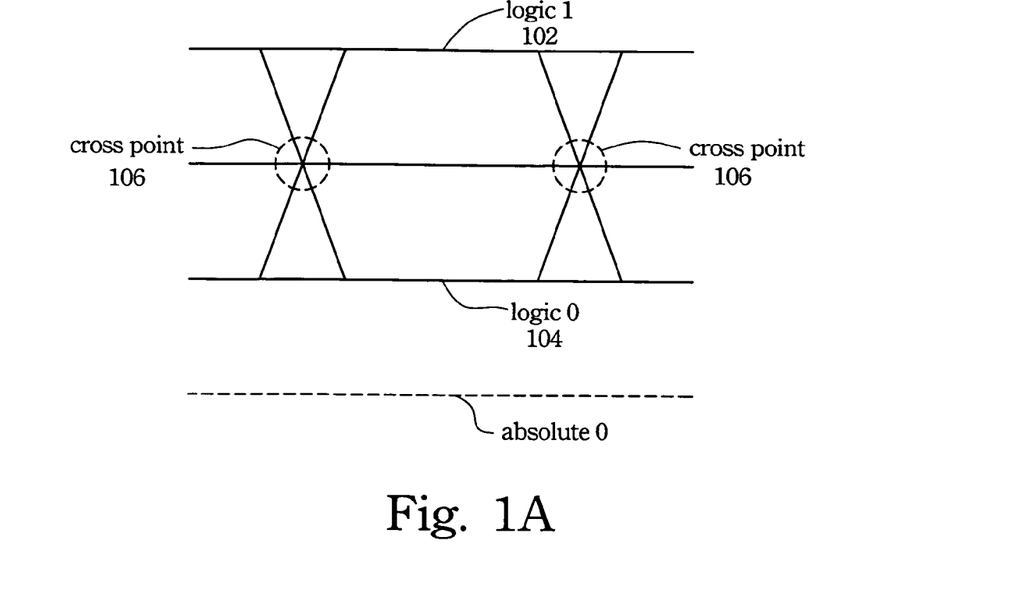
FIG. 1A illustrates the eye diagram of the laser driver circuit 202 used for continuous mode applications.
Figure 1B:
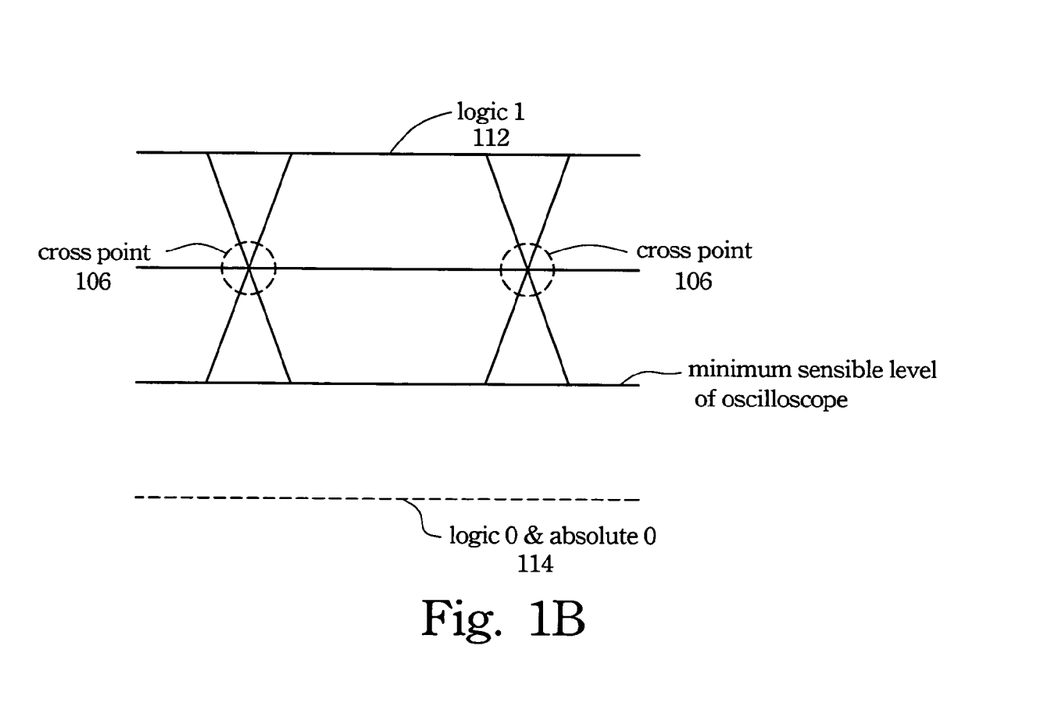
FIG. 1B illustrates the eye diagram of the laser driver circuit 202 used for burst mode applications.

FIG. 1A illustrates the eye diagram of the laser driver circuit 202 used for continuous mode applications. FIG. 1B illustrates the eye diagram of the laser driver circuit 202 used for burst mode applications. In FIG. 1A, the laser driver circuit 202 uses average power control, so that when the temperature varies, the logic 1 102 and the logic 0 104 can be maintained at stable levels. In FIG. 1B, the laser driver circuit 202 does not use average power control, so other methods have to be used to keep the logic 1 112 and the logic 0 114 at stable levels. The logic 1 112 is the high level of the eye diagram. The logic 0 114 is the low level of the eye diagram. The embodiment is described with reference to FIG. 1B.

With reference to FIG. 2, the laser driver circuit 202 generates a positive temperature compensation signal 210 from the temperature compensation output 216 in response to the environmental temperature. The positive temperature compensation signal 210 is, for example, a voltage signal proportional to the environmental temperature. The first bias adjustment circuit 204 receives the positive temperature compensation signal 210 to generate a modulation current setting signal 212. The modulation current setting signal 212 is sent to the modulation current setting input 218 of the laser driver circuit 202. The second bias adjustment circuit 206 receives the positive temperature compensation signal 210 to generate a bias current setting signal 214. The bias current setting signal 214 is sent to the bias current setting input 220 of the laser driver circuit 202.

The laser driver circuit 202 receives the modulation current setting signal 212 to set the modulation current. The laser driver circuit 202 also receives the bias current setting signal 214 to set the bias current. The modulation current of the laser transmitting apparatus is used to adjust the level of logic 1 112. The bias current is used to adjust the level of logic 0 114.

With the connection method mentioned above, the laser driver circuit 202 automatically adjusts the modulation current and the bias current in response to the environmental temperature, so that the levels of logic 1 112 and the logic 0 114 are kept stable. The cross point 106 is also maintained stable to meet the requirements of burst mode.

The first bias adjustment circuit 204 is, for example, a resistor or a conducting wire. The first bias adjustment circuit 204 limits the voltage of the positive temperature compensation signal 210 and makes the voltage fall within the acceptable voltage range of the modulation current setting signal 212. The second bias adjustment circuit 206 is, for example, a resistor or a conducting wire. The second bias adjustment circuit 206 limits the voltage of the positive temperature compensation signal 210 to the acceptable voltage range of the bias current setting signal 214. The acceptable voltage range is the maximum variation range of the high level of the eye diagram that can be determined by the modulation current setting signal 212 or the maximum variation range of the low level of the eye diagram that can be determined by the bias current setting signal 214.

For example, as shown in FIG. 2, Vx represents the acceptable voltage range for the modulation current setting input or the bias current setting input. Va represents the voltage of the temperature compensation signal. Vb is the voltage drop on the first or the second bias adjustment circuit. Vx=Va−Vb. If Va<Vx, the positive temperature compensation signal 210 falls in the voltage range of the modulation current setting input 218 or the bias current setting input 220. At this time, the first bias adjustment circuit 204 or the second bias adjustment circuit 206 can be a conducting wire. If Va>Vx, the first bias adjustment circuit 204 or the second bias adjustment circuit 206 can be a resistor. Thus, the first bias adjustment circuit and the second bias adjustment circuit are used to limit the voltages sent to the modulation current setting input and the bias current setting input, so that overcompensation is prevented.

Because the positive temperature compensation signal 210 is used to achieve another objective, the original function of average power control is not used. Moreover, the pulse width adjustment input is grounded through a resistor. The reference current setting input of the laser driver circuit 202 is also grounded through a resistor.

Embodiment 2

Figure 3:
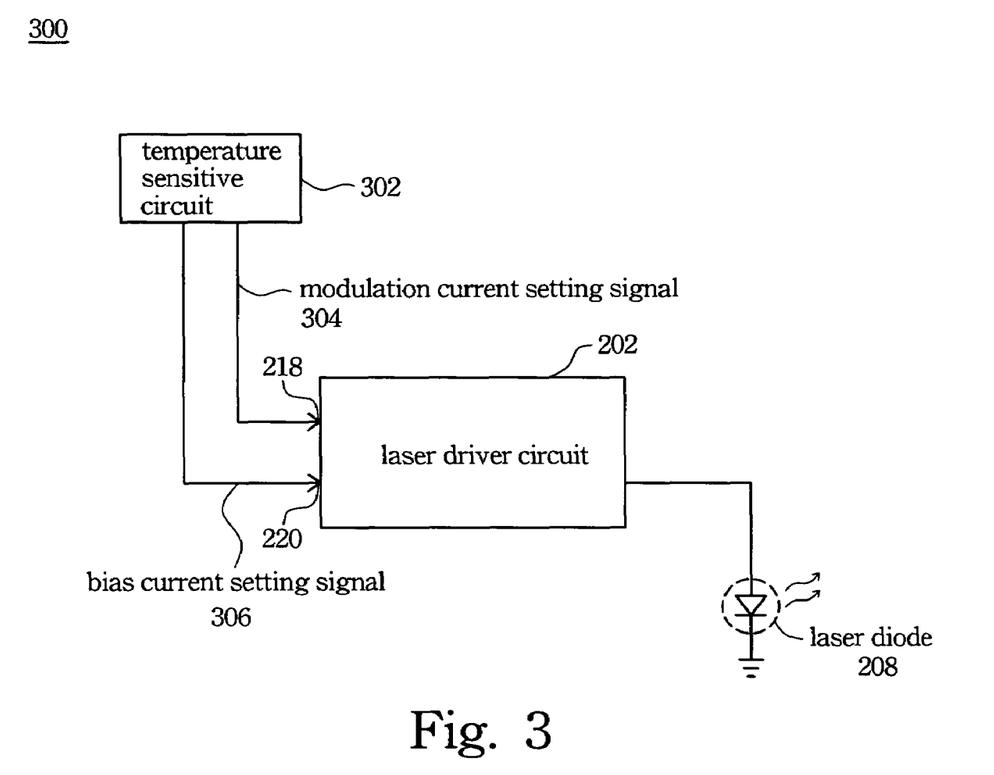
FIG. 3 is a block diagram illustrating the second preferred embodiment of the invention.
Figure 4A:
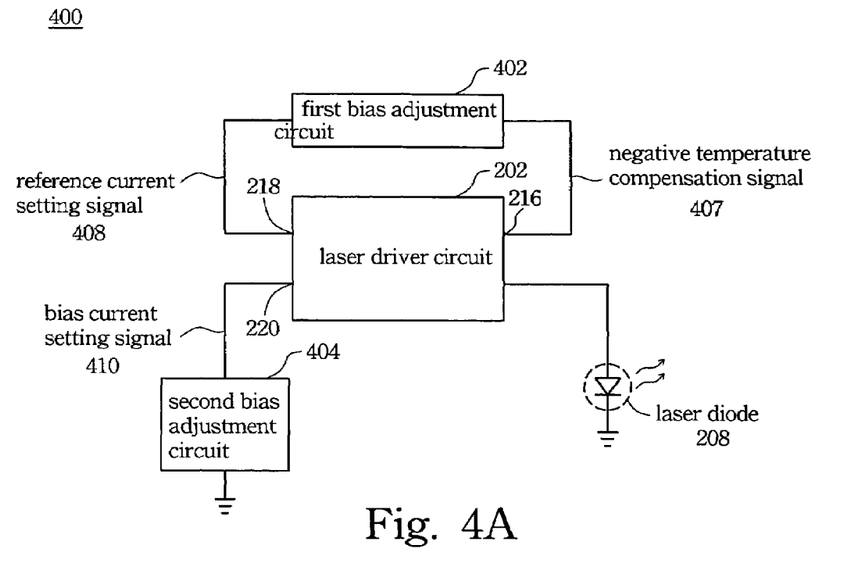
FIG. 4A is a block diagram illustrating the third embodiment of the invention.

When the relationship between the temperature compensation signal of the laser driver circuit and the temperature being inversely proportional, an external circuit modification is needed for the laser driver circuit 202, as shown in FIG. 3 and FIG. 4A. FIG. 3 is a block diagram illustrating the second preferred embodiment of the invention. When the relationship between the temperature compensation signal and the temperature is inversely proportional or the laser driver circuit does not have a temperature compensation signal, another temperature sensitive circuit 302 having the function of positive temperature compensation is needed. In FIG. 3, the laser transmitting apparatus 300 includes a laser driver circuit 202, a laser diode 208, and a temperature sensitive circuit 302. The laser diode 208 and the temperature sensitive circuit 302 are connected to the laser driver circuit 202, respectively.

The laser driver circuit 202 provides a driving current to the laser diode 208 to generate a laser light. The temperature sensitive circuit 302 generates a modulation current setting signal 304 and a bias current setting signal 306 in response to the environmental temperature. The modulation current setting signal 304 is sent to the modulation current setting input 218 of the laser driver circuit 202. The bias current setting signal 306 is sent to the bias current setting input 220 of the laser driver circuit 202. The modulation current setting signal 304 is a signal proportional to the environmental temperature. The bias current setting signal 306 is also a signal proportional to the environmental temperature.

With reference to FIG. 1B and FIG. 3, the temperature sensitive circuit 302 automatically adjusts the modulation current and the bias current of the laser driver circuit 202 in response to the environmental temperature, so that the levels of the logic 1 112 and the logic 0 114 are stably maintained to meet the requirements of burst mode.

Embodiment 3

When the relationship between the temperature compensation signal and the temperature is inversely proportional, there is another way to modify the external circuit, as shown in FIG. 4A. FIG. 4A is a block diagram illustrating the third embodiment of the invention. The laser transmitting apparatus 400 includes a laser driver circuit 202, a first bias adjustment circuit 402, a second bias adjustment circuit 404, and a laser diode 208. The first bias adjustment circuit 402, the second bias adjustment circuit 404, and the laser diode 208 are respectively connected to the laser driver circuit 202.

The laser driver circuit 202 provides a driving current to the laser diode 208 to generate a laser light. The laser driver circuit 202 generates a negative temperature compensation signal 407 in response to the environmental temperature. The relationship between the negative temperature compensation signal 407 and the environmental temperature is inversely proportional. The first bias adjustment circuit 402 receives the negative temperature compensation signal 407 to generate a modulation current setting signal 408. The second bias adjustment circuit 404 generates a bias current setting signal 410. Thus, the slope of the characteristic curve of the negative temperature compensation signal 407 (versus temperature) is negative.

With reference to FIG. 1B and FIG. 4A, the laser driver circuit 202 receives the reference current setting signal 408 and the bias current setting signal 410 to adjust the reference current and the bias current, so that the levels of the logic 1 112 and the logic 0 114 are stably maintained.

Figure 4B:
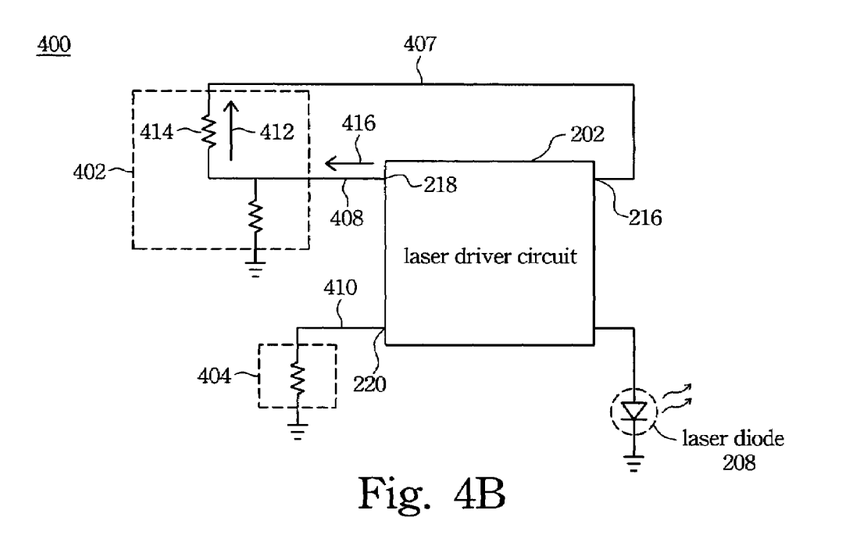
FIG. 4B is a diagram illustrating an example of the third embodiment of the invention.

FIG. 4B is a diagram illustrating the third embodiment of the invention. The first bias adjustment circuit 402 includes two resistors. The second bias adjustment circuit 404 is a resistor. When the environmental temperature rises, the negative temperature compensation signal 407 (such as a voltage signal) falls. Therefore, the current 412 flowing through the resistor 414 rises. The current 416 also rises. Thus, the reference current setting signal 408 (such as a current) rises to achieve the objective of compensating for the reference current.

Based on the embodiments described above, the invention also provides a method for applying a continuous laser driver circuit for burst mode applications. The method is suitable for use in a situation where the relationship between the temperature compensation signal and the environment temperature is inversely proportional.

Figure 5:
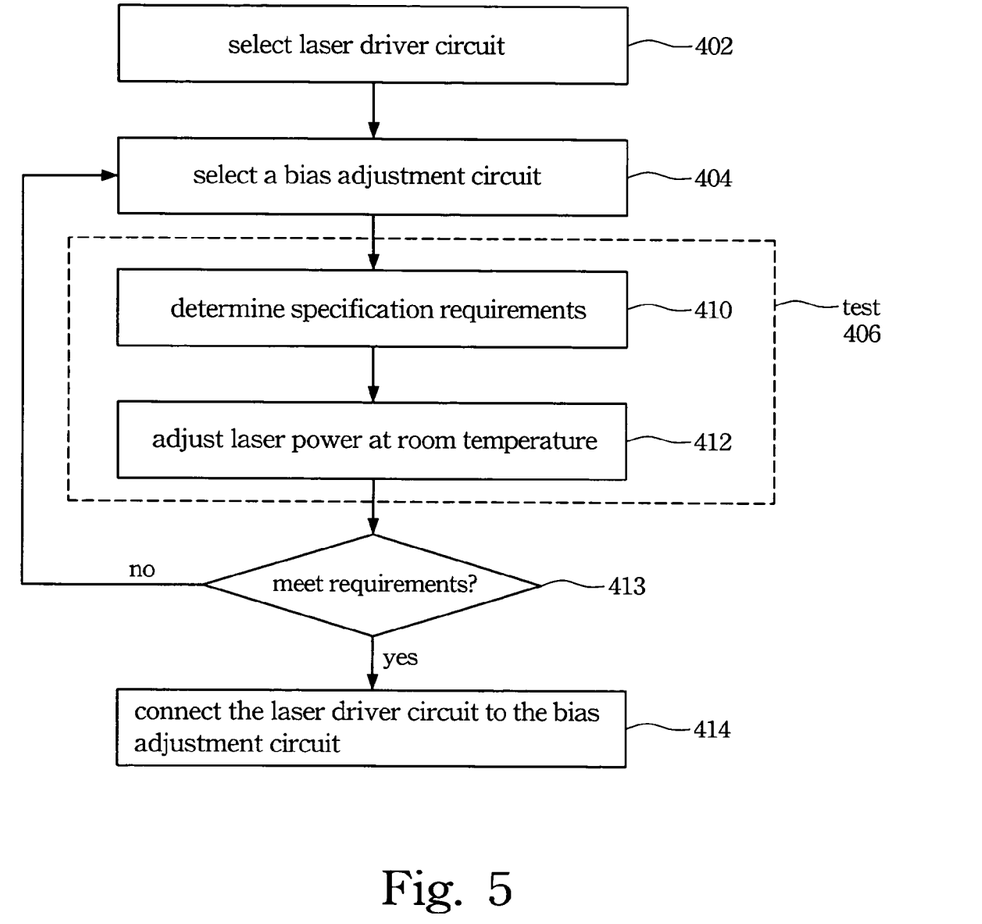
FIG. 5 is a flow chart of the method.

With reference to FIG. 4A and FIG. 5, first, a continuous mode laser driver chip is selected (step 402). The chip has a temperature compensation signal output, a bias current setting input, and a reference current setting input. The chip is used to drive a laser diode to generate a laser light.

Next, the temperature compensation signal from the temperature compensation signal output is converted through the first bias adjustment circuit (step 404) into a reference current setting signal to be fed into the reference current setting input. Then, the bias current setting input is grounded through a second bias adjustment circuit. The reference current setting signal automatically adjusts the high level and the low level of the eye diagram of the laser diode, so that the high level and the low level are stably maintained to reduce the bit error rate in transmission.

Because complete temperature tests in the range of 0 to 70 degrees Celsius cost a lot of money and time, adjusting the laser power at room temperature is more feasible. The following is an example of adjusting the laser power at room temperature.

In the range of 0 to 70 degrees Celsius, if the required average value of laser power of the laser transmitting apparatus is in the range of −1.5 dBm to 3.5 dBm (step 410), then the resistor value of the bias adjustment circuit is adjusted at room temperature, so that the average laser power reaches 0 dBm at room temperature.

In the range of 0 to 70 degree Celsius, when the laser driver circuit is turned off and if the required average value of laser power is −43 dBm, then the resistor value of the bias adjustment is adjusted (step 412), so that when the laser driver circuit is turned off (that is, when no input signal is fed into the laser driver circuit), the average laser power reaches −46 dBm.

If the method mentioned above cannot meet the requirements, then step 404 to step 412 have to be repeated. Thus, the first bias adjustment circuit 402 and the second bias adjustment circuit 404 are repeatedly changed and tested until the laser driver circuit 202 meets the requirements. The suitable bias adjustment circuits are then connected to the laser driver circuit 202 (step 414).

If proper resistor values are applied in the bias adjustment circuits of the three embodiments mentioned above, the variation of the level of logic 1 of the laser power can be within 1 dBm, and that of logic 0 of the laser power can be within 6 dBm. The laser power mentioned above is in situations where the environmental temperature is in the range of 0 to 70 Celsius.

In the second and the third preferred embodiments, the requirements for selecting a continuous laser driver circuit are the same as the requirements mentioned in the first preferred embodiment. Similarly, in the second and the third preferred embodiments, no bias current setting time is needed for the laser transmitting apparatus.

Although the present invention has been described in considerable detail with reference to certain preferred embodiments thereof, other embodiments are possible. Therefore, the spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for utilizing a continuous mode laser driver circuit for a burst mode application, the method comprising:
    selecting a continuous mode chip having a temperature compensation signal output, a bias current setting input, and a reference current setting input, the chip used to drive a laser diode to generate a laser light;
    converting the temperature compensation signal from the temperature compensation signal output into a reference current setting signal through a first bias adjustment circuit, wherein the reference current setting signal is input to a reference current setting input; and
    connecting the bias current setting input to ground through a second bias adjustment circuit;
    wherein the reference current setting signal automatically adjusts the high level and the low level of the eye diagram of the laser light in response to the environmental temperature, so that the high level and the low level are kept substantially stable to reduce the bit error rate in transmission.

2. The method of claim 1, wherein the temperature compensation signal has an inverse relationship with temperature.

3. The method of claim 1, wherein the requirements of selecting the continuous laser driver chip comprise:
    the laser driver chip is workable in an open loop; and
    the lowest workable frequency of the laser driver chip in continuous mode has to be higher than 2.5 GHz even if the chip is working under 1.5 GHz in the burst mode.

4. The method of claim 1, further comprising:
    repeatedly changing the first bias adjustment circuit and the second bias adjustment circuit until the high level and the low level are kept substantially stable.

5. The method of claim 1, wherein the first bias adjustment circuit is a resistor or a conducting wire, the method further comprising:
    when the voltage range of the temperature compensation signal is in the acceptable voltage range of the reference current setting input, directly connecting the temperature compensation signal output to the reference current setting input by the first bias adjustment circuit, which is a conducting wire; and
    when the voltage range of the temperature compensation signal is out of the acceptable voltage range of the reference current setting input, repeatedly selecting a suitable resistor for connecting the temperature compensation output to the reference current setting input until the high level and the low level of the eye diagram of the laser power of the laser diode substantially reach stability.

6. The method of claim 1, further comprising setting the laser power to the range of −1.5 to 3.5 dBm when the temperature is in the range of 0 to 70 degrees Celsius.

7. The method of claim 1, further comprising:
    adjusting the average laser power;
    wherein when the temperature is in the range of 0 to 70 degrees Celsius, the laser power must be limited to the range between −1.5 to 3.5 dBm;
    and wherein the resistor values of the first bias adjustment circuit and the second bias adjustment circuit are adjusted at room temperature, so that the average laser power at room temperature is 0 dBm; and
    adjusting the average laser power when the laser driver circuit is turned off;
    wherein when the laser driver circuit is turned off and the laser power of no more than −43 dBm is required, an average variation of 3 dBm in the laser power is possibly achieved with the variation of temperature to prevent the laser power from being out of the limited range due to the variation of temperature, the resistor values of the first bias adjustment circuit and the second bias circuit are adjusted at room temperature so that the laser power is lower than −46 dBm.

8. A laser transmitting apparatus for a burst mode application, the laser transmitting apparatus comprising:
    a first bias adjustment circuit for receiving a temperature compensation signal to generate a modulation current setting signal;
    a second bias adjustment circuit for receiving the temperature compensation signal to generate a bias current setting signal; and
    a laser driver circuit connected to the first bias adjustment circuit and the second bias adjustment circuit, the laser driver circuit for providing a driving current to a laser diode to generate a laser light, the laser driver circuit generating the temperature compensation signal in response to the environmental temperature, the laser driver circuit receiving the modulation current setting signal to set a modulation current, the laser driver circuit receiving the bias current setting signal to set a bias current;
    wherein the relationship between the temperature compensation signal and the temperature is directly proportional, and the laser driver circuit substantially stably maintains the high level and the low level of the eye diagram of the laser power according to the bias current and the modulation current.

9. The laser transmitting apparatus of claim 8, wherein the laser driver circuit is a laser driver chip, the laser driver chip is workable in open loop mode, the laser driver chip has a temperature compensation signal output, the laser driver circuit must have a bias current setting input, the laser driver circuit must have a modulation current setting input, and the workable frequency of the continuous mode laser driver circuit needs to be equal to or higher than 2.5 GHz even if the laser driver circuit is working under the frequency of 1.5 GHz in burst mode.

10. The laser transmitting apparatus of claim 8, wherein the first bias adjustment circuit is a resistor or a conducting wire.

11. The laser transmitting apparatus of claim 8, wherein the second bias adjustment circuit is a resistor or a conducting wire.

12. The laser transmitting apparatus of claim 8, wherein when the temperature is in the range of 0 to 70 degrees Celsius, the cross points of the eye diagram are maintained at a predetermined level.

13. A laser transmitting apparatus for continuous mode applications, the laser transmitting apparatus comprising:
   a laser driver circuit for providing a driving current to a laser diode to generate a laser light, the laser driver circuit receiving a modulation current setting signal to set a modulation current, the laser driver circuit receiving a bias current setting signal to set a bias current; and
   a temperature sensitive circuit connected to the laser driver circuit, the temperature sensitive circuit generating the modulation current setting signal and the bias current setting signal, both of which have directly proportional relationships with the temperature;
   wherein the laser driver circuit substantially stably maintains the high level and the low level of the eye diagram of the laser diode according to the bias current and the modulation current.

14. The laser transmitting apparatus of claim 13, wherein the laser driver circuit is a laser driver chip, the laser driver chip is workable in open loop mode, the laser driver chip has a temperature compensation signal output, the laser driver circuit must have a bias current setting input, the laser driver circuit must have a modulation current setting input, and the workable frequency of the continuous mode laser driver circuit needs to be equal to or higher than 2.5 GHz even if the laser driver circuit is working under the frequency of 1.5 GHz in burst mode.

15. The laser transmitting apparatus of claim 13, wherein the modulation current setting signal is a current and the value of the current is proportional to the environmental temperature.

16. The laser transmitting apparatus of claim 13, wherein the bias current setting signal is a current and the value of the current is proportional to the environmental temperature.

17. A laser transmitting apparatus for burst mode applications, the laser transmitting apparatus comprising:
   a first bias adjustment circuit for receiving a temperature compensation signal to generate a reference current setting signal;
   a second bias adjustment circuit for generating a bias current setting signal;
   a laser driver circuit connected to the first bias adjustment circuit and the second bias adjustment circuit, wherein the laser driver is used to provide a driving current to a laser diode to generate a laser light, the laser driver circuit generates the temperature compensation signal according to environmental temperature, the laser driver circuit receives the reference current setting signal to set a reference current, and the laser driver circuit receives the bias current setting signal to set a bias current;
   wherein the relationship between the temperature compensation signal and the temperature is inversely proportional, the laser driver circuit stably maintains the high level and the low level of the eye diagram of the laser diode in response to the bias current and the reference current.

18. The laser transmitting apparatus of claim 17, wherein the laser driver circuit is a laser driver chip, the laser driver chip is workable in open loop mode, the laser driver chip has a temperature compensation signal output, the laser driver circuit must have a bias current setting input, the laser driver circuit must have a reference current setting input, and the workable frequency of the laser driver circuit needs to be equal to or higher than 2.5 GHz even if the laser driver circuit is working under the frequency of 1.5 GHz in burst mode.

19. The laser transmitting apparatus of claim 17, wherein the first bias adjustment circuit is a resistor or a conducting wire.

20. The laser transmitting apparatus of claim 17, wherein the second bias adjustment circuit is a resistor or a conducting wire.

* * * * *